United States Patent
Chai et al.

(10) Patent No.: US 10,746,803 B2
(45) Date of Patent: Aug. 18, 2020

(54) FAULT DETECTION AND ISOLATION IN GENERATOR MODULES

(71) Applicant: Hamilton Sundstrand Corporation, Charlotte, NC (US)

(72) Inventors: Huazhen Chai, Caledonia, IL (US); Dwight D. Schmitt, Rockford, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 46 days.

(21) Appl. No.: 16/212,192

(22) Filed: Dec. 6, 2018

(65) Prior Publication Data
US 2020/0182934 A1    Jun. 11, 2020

(51) Int. Cl.
| | | |
|---|---|---|
| *G01R 31/02* | (2006.01) | |
| *G01R 31/26* | (2020.01) | |
| *G01R 31/34* | (2020.01) | |
| *G01R 31/42* | (2006.01) | |
| *G01R 19/00* | (2006.01) | |
| *G01R 31/40* | (2020.01) | |
| *H02M 5/42* | (2006.01) | |
| *H02M 7/06* | (2006.01) | |

(52) U.S. Cl.
CPC ....... *G01R 31/343* (2013.01); *G01R 19/0092* (2013.01); *G01R 31/2632* (2013.01); *G01R 31/2635* (2013.01); *G01R 31/2642* (2013.01); *G01R 31/40* (2013.01); *G01R 31/42* (2013.01); *H01L 2924/00* (2013.01); *H01L 2924/0002* (2013.01); *H01L 2924/00014* (2013.01); *H02M 5/42* (2013.01); *H02M 7/06* (2013.01)

(58) Field of Classification Search
CPC ............ G01R 31/2635; G01R 31/2632; G01R 31/40; G01R 19/0092; G01R 31/2642; H01L 2924/0002; H01L 2924/00; H01L 2924/00014
USPC ......... 324/71, 378, 403, 415, 425, 500, 537, 324/762.01, 762.07
See application file for complete search history.

(56) References Cited

U.S. PATENT DOCUMENTS

| | | |
|---|---|---|
| 4,956,598 A | 9/1990 | Recker et al. |
| 5,552,952 A | 9/1996 | Kramer et al. |
| 2014/0117912 A1 | 5/2014 | Gajic et al. |

(Continued)

OTHER PUBLICATIONS

European Search Report for Application No. 19213977.2, dated Apr. 29, 2020, 7 pages.

*Primary Examiner* — Raul J Rios Russo
(74) *Attorney, Agent, or Firm* — Cantor Colburn LLP

(57) ABSTRACT

A fault detection method includes, at a generator module having a generator, a rectifier connected to the generator by phase leads, and an inverter connected to the rectifier by a direct current (DC) link, receiving a measurement of voltage applied to the rectifier by the phase leads and receiving a measurement of voltage applied to the inverter by the DC link. DC link voltage balance and sequence voltages are calculated using the measurement of voltage applied to the rectifier by the phase leads and the measurement of voltage applied to the inverter by the DC link. Determination is made using the DC link voltage balance and phase sequence voltages when no fault exists in the generator module. Determination is made that a fault condition exists using the DC link voltage balance and phase sequence voltages when a fault exists in the generator module. Generator modules are also described.

20 Claims, 3 Drawing Sheets

(56) References Cited

U.S. PATENT DOCUMENTS

| | | | |
|---|---|---|---|
| 2014/0233278 A1* | 8/2014 | Li | H02M 7/53873 |
| | | | 363/37 |
| 2016/0146902 A1 | 5/2016 | Mirzaei | |
| 2016/0268831 A1 | 9/2016 | Spooner et al. | |
| 2017/0365993 A1 | 12/2017 | Wagner et al. | |
| 2018/0112647 A1 | 4/2018 | Abeyasekera et al. | |
| 2020/0021103 A1* | 1/2020 | Frampton | G01R 31/50 |
| 2020/0021184 A1* | 1/2020 | Frampton | H02M 1/32 |

* cited by examiner

| | | Vp | Vn | Vz | Vdc |
|---|---|---|---|---|---|
| 1 | Normal Gen Off | 0 | 0 | 0 | 0 |
| 2 | Normal Operation | 100% | 0 | 0 | 100% |
| 3 | Normal Imbalance | 100% | 5% | 0 | 100% |
| 4 | L - G - short | 100% | 0 | >50% | 100% |
| 5 | L - L - short | 95% | >50% | 0 | 95% |
| 6 | L - L - G short | 95% | >50% | >50% | 95% |
| 7 | L - L - L short | 0 | 0 | 0 | 0 |
| 8 | L - L - L - G short | 0 | 0 | 0 | 0 |
| 9 | 1 to 5 Diodes short | 95% | >50% | 0 | 0 |
| 10 | 1 to 5 Diodes open | 100% | >25% | >25% | 0 |
| 11 | All 6 Diodes short | 0 | 0 | 0 | 0 |
| 12 | All 6 Diodes open | 100% | 0 | 0 | 0 |

FAULT DETECTION AND ISOLATION IN GENERATOR MODULES

BACKGROUND

The invention relates to electrical systems, and more particularly to fault detection and isolation in generator modules employed in electrical systems.

Generators, such as in aircraft electrical systems, can sometimes develop open and short circuit faults during operation. Electrical systems therefore generally include current transformers for detecting such open and short circuit generator faults.

One challenge with using such current transformers is related to the size and the weight associated them. More specifically, because the primary winding of the current transformer is typically incorporated into the protected circuit, employment of current transformers generally increases the weight and space required for the electrical system. This is particularly the case when current transformers are employed for the detection of internal faults in the generators as current transformers can be required for one or more of the output conductors, which requires spacing the power converter from the generator to provide space for the current transformer, as well as for the conductor connecting the generator neutral phase to ground.

Such fault detection methods and generator modules have generally been considered suitable for their intended purpose.

BRIEF SUMMARY

A fault detection method is provided. The method includes, at a generator module having a generator, a rectifier connected to the generator by a plurality of phase leads, and an inverter connected to the rectifier by a direct current (DC) link, receiving a measurement of voltage applied to the rectifier by the phase leads and receiving a measurement of voltage applied to the inverter by the DC link. DC link voltage balance and phase sequence voltages are calculated using the measurement of voltage applied to the rectifier by the phase leads and the measurement of voltage applied to the inverter by the DC link. A normal condition is determined to exist using the DC link voltage balance and phase sequence voltages when no fault exists in the generator module and a fault condition is determined to exist using the DC link voltage balance and phase sequence voltages when a fault exists in the generator module.

In addition to one or more of the features described above, or as an alternative, further embodiments may include wherein receiving a measurement of voltage applied to the rectifier comprises measuring voltage at an A-phase lead, a B-phase lead, and a C-phase lead.

In addition to one or more of the features described above, or as an alternative, further embodiments may include wherein calculating phase sequence voltages comprises calculating positive sequence voltage, negative sequence voltage, and zero sequence voltage.

In addition to one or more of the features described above, or as an alternative, further embodiments may include wherein calculating phase sequence voltages comprises calculating positive sequence voltage according to: $V_p=(V_a+k*V_b+k^2*V_c)$, where $k=-\frac{1}{2}+j\ Sqrt\ (3)/2$.

In addition to one or more of the features described above, or as an alternative, further embodiments may include wherein calculating phase sequence voltages comprises calculating negative sequence voltage according to: $V_n=(V_a+k^2*V_b+k*V_c)$, where $k=-\frac{1}{2}+j\ Sqrt\ (3)/2$.

In addition to one or more of the features described above, or as an alternative, further embodiments may include wherein calculating phase sequence voltages comprises calculating zero sequence voltage according to: $V_z=V_a+V_b+V_c$.

In addition to one or more of the features described above, or as an alternative, further embodiments may include wherein receiving a measurement of voltage applied to the inverter by the DC link comprises measuring voltage at a DC link positive lead and a DC link negative lead.

In addition to one or more of the features described above, or as an alternative, further embodiments may include wherein the measurements of voltage at the DC link positive lead and the DC link negative lead are relative to a ground terminal.

In addition to one or more of the features described above, or as an alternative, further embodiments may include wherein the DC link voltage imbalance is calculated according to: $V_{dc}=V^+-V^-$.

In addition to one or more of the features described above, or as an alternative, further embodiments may include wherein determining that a normal condition exists comprises determining that the generator is operating in an imbalanced condition.

In addition to one or more of the features described above, or as an alternative, further embodiments may include wherein determining that a fault condition exists includes isolating the fault condition to a fault selected from (a) L-G short, (b) L-L short, (c) L-L-G short, (d) L-L-L short, and (e) L-L-L-G short exists in the generator module.

In addition to one or more of the features described above, or as an alternative, further embodiments may include wherein determining that a fault condition exists includes isolating the fault condition to a diode short within the rectifier.

In addition to one or more of the features described above, or as an alternative, further embodiments may include wherein determining that a fault condition exists includes isolating the fault condition to a diode open within the rectifier.

In addition to one or more of the features described above, or as an alternative, further embodiments may include wherein determining a fault condition exists comprises matching the calculated DC link voltage imbalance and sequence voltages to a lookup table associating DC link voltage imbalance and sequence voltages to generator module conditions.

A generator module is also provided. The generator module includes a generator, a rectifier connected to the generator by a plurality of phase leads, an inverter connected to the rectifier by a direct current (DC) link, and a controller. The controller is disposed in communication with the plurality of phase leads and the DC link and is responsive to instructions recorded on a memory to receive a measurement of voltage applied to the rectifier by the phase leads, receive a measurement of voltage applied to the inverter by the DC link, calculate DC link voltage balance and phase sequence voltages using the measurement of voltage applied to the rectifier by the phase leads and the measurement of voltage applied to the inverter by the DC link, determine that a normal condition exists using the DC link voltage balance and phase sequence voltages when no fault exists in the generator module, and determine that a fault condition exists using the DC link voltage balance and phase sequence voltages when a fault exists in the generator module.

In addition to one or more of the features described above, or as an alternative, further embodiments may include wherein the plurality of phase leads comprises an A-phase lead, a B-phase lead, and a C-phase lead, the generator module additionally including an A-phase voltage sensor coupled to the A-phase lead and disposed in communication with the controller, a B-phase voltage sensor coupled to the B-phase lead and disposed in communication with the controller, and a C-phase voltage sensor coupled to the C-phase lead and disposed in communication with the controller.

In addition to one or more of the features described above, or as an alternative, further embodiments may include wherein the instructions recorded on the memory cause the controller to calculate positive sequence voltage according to $V_p=(V_a+k*V_b+k^2*V_c)$ where $k=-\frac{1}{2}+j\ Sqrt\ (3)/2$, calculate negative sequence voltage according to: $V_n=(V_a+k^2*V_b+k*V_c)$, and calculate zero sequence voltage according to: $V_z=V_a+V_b+V_c$ where $V_a$ is voltage applied to the A-phase lead, where $V_b$ is voltage applied to the B-phase lead, and where $V_c$ is voltage applied to the C-phase lead.

In addition to one or more of the features described above, or as an alternative, further embodiments may include wherein the DC link comprises a positive lead and a negative lead, the generator module additionally including a ground terminal, a positive lead voltage sensor coupled the positive lead and the ground terminal, the positive lead voltage sensor disposed in communication with the controller, and a negative lead voltage sensor coupled the negative lead and the ground terminal, the negative lead voltage sensor disposed in communication with the controller.

In addition to one or more of the features described above, or as an alternative, further embodiments may include wherein the instructions cause the controller to calculate DC link voltage using the measurement of voltage applied to the inverter by the DC link according to $V_{dc}=V^+-V^-$, $V^+$ being voltage across the positive lead and the ground terminal, where $V^-$ being voltage across the negative lead and the ground terminal.

In addition to one or more of the features described above, or as an alternative, further embodiments may include wherein no current sensor is located between the generator and the rectifier to measure current through the plurality of phase leads connecting the generator to the rectifier, wherein the generator neutral phase is not connected to ground.

Technical effects of embodiments of the present disclosure include generator modules that relatedly lightweight and require less space that generator modules incorporating current transformers.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION

Figure 1:
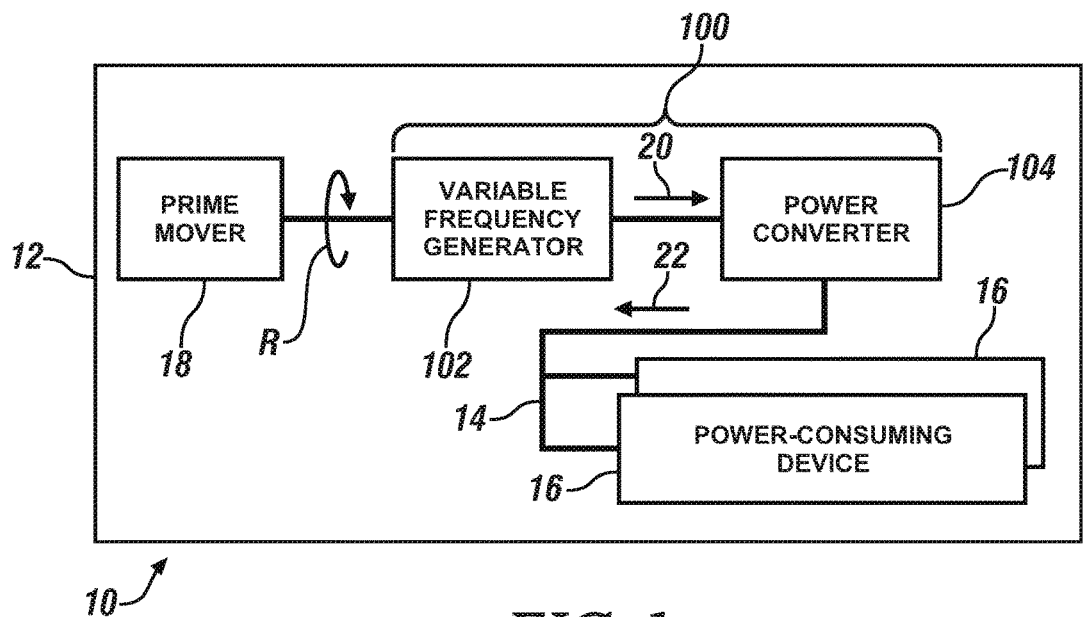
FIG. 1 is a schematic view of an aircraft electrical system constructed in accordance with the present disclosure, showing a prime mover operably connected to a generator module to provide power to electrical devices carried by an aircraft.

Reference will now be made to the drawings wherein like reference numerals identify similar structural features or aspects of the subject disclosure. For purposes of explanation and illustration, and not limitation, a partial view of an exemplary embodiment of a generator module in accordance with the present disclosure is shown in FIG. 1 and is designated generally by reference character 100. Other embodiments of generator modules and methods of detecting faults in generator modules in accordance with the disclosure, or aspects thereof, are provided in FIGS. 2-5, as will be described. The fault detection methods and generator modules can be used to provide fault detection and fault-protected generator modules without current transformers, such as in aircraft electrical systems, though the present disclosure is not limited to aircraft electrical systems or to electrical systems lacking current transformers in general.

Referring to FIG. 1, an aircraft 10 is shown. The aircraft 10 includes an electrical system 12 having the generator module, a power bus 14, and a plurality of power-consuming devices 16. The generator module includes 100 a generator 102 and a power converter 104. A prime mover 18, e.g., a main engine or auxiliary power unit (APU), is operatively connected to the generator 102 for generating variable frequency electrical power (shown by reference numeral 20) using mechanical rotation provided to the generator 102 of the generator module 100. The generator 102 is electrically connected to the power converter 104 and provides thereto the variable frequency electrical power 20. The power converter 104 is configured and adapted for converting the variable frequency electrical power 20 into constant frequency electrical power 22, which is suitable for the power consuming devices 16. The power-consuming devices 16 are electrically connected to the power converter 104 through the power bus 14 to receive therethrough the constant frequency electrical power 22.

In the illustrated embodiment the generator module 100 is a variable-speed constant frequency (VSCF) generator module. In this respect rotation R provided to the generator 102 by the prime mover 18 is variable speed rotation, which causes the variable frequency electrical power 20 provided to the generator 102 to vary in frequency according to the speed of the mechanical rotation R applied by the prime mover 18 to the generator 102. The power converter 104 is a constant frequency output power converter and is arranged to provide the constant frequency electrical power 22 to the power-consuming devices 16 as constant frequency AC power. Examples of VSCF generators includes those described in U.S. Patent Application Publication No. 2017/0365993 A1 to Wagner et al., filed on Jun. 15, 2016, the contents of which are incorporated herein by reference in its entirety.

Figure 2:
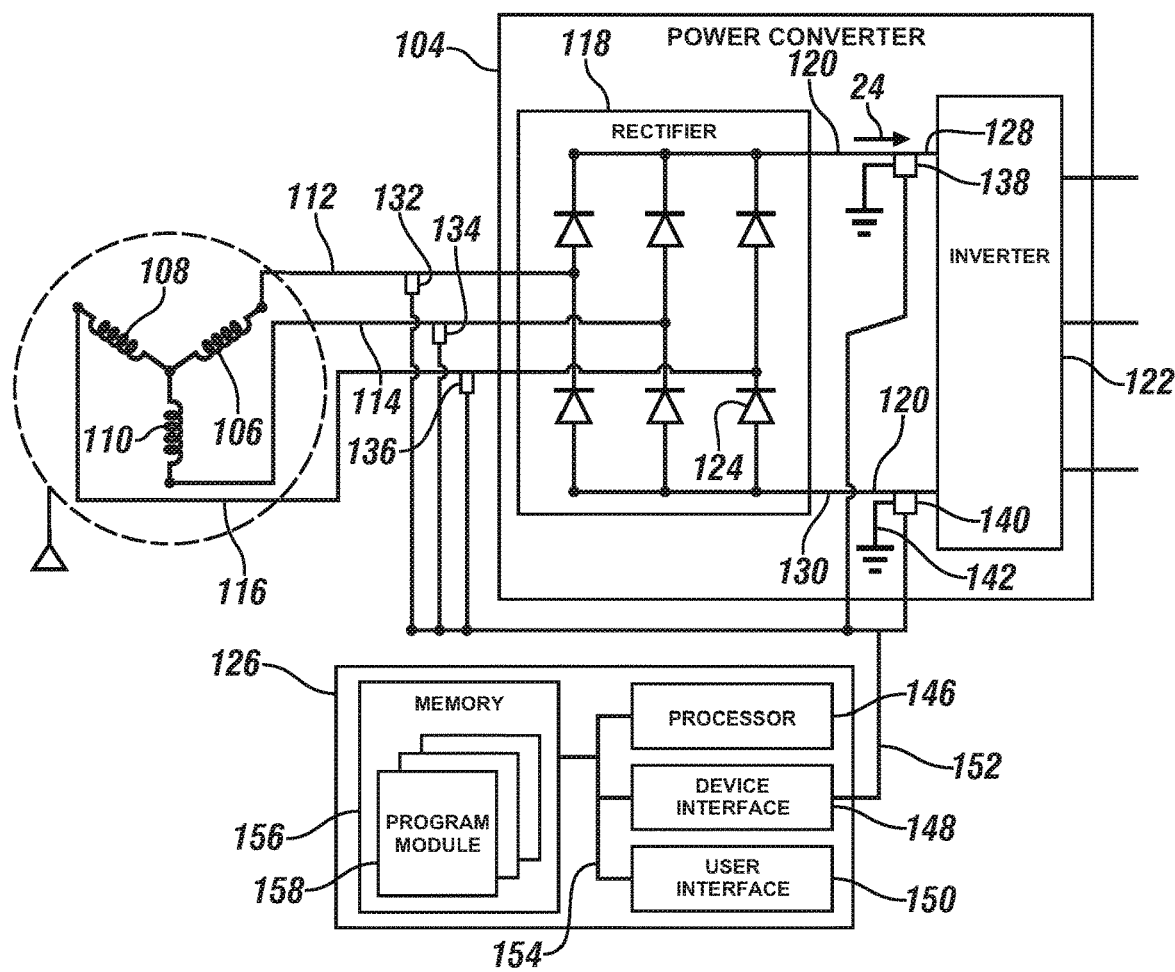
FIG. 2 is a schematic view of the generator module illustrated in FIG. 1, showing voltage sensors coupled to phase leads and direct current (DC) link leads within the generator module for detecting and isolating faults in the generator module.

With reference to FIG. 2, the generator module 100 is shown according to an embodiment. As shown in FIG. 2, the generator 102 is a 3-phase generator including an A-phase winding 106, a B-phase winding 108, and a C-phase winding 110. The A-phase winding 106 is connected to the power converter 104 by an A-phase lead 112. The B-phase winding 108 is connected to the power converter 104 by a B-phase lead 114. The C-phase winding 110 is connected to the power converter 104 by a C-phase lead 116. No current transformers are arranged between the generator 102 and the power converter 104 for measuring current flow through the A-phase lead 112, the B-phase lead 114, and/or the C-phase lead 116. As such, the generator module 100 does not include (i.e. is without) any current transformers in the embodiment shown in FIG. 2. The neutral phase of the generator is not grounded and additionally does not include a current transformer. In certain embodiments, the power converter 104 is integrated into the generator 102, the generator module 100 being an integrated generator module. As will be appreciated by those of skill in the art, being without current transformers, the generator module 100 can be lightweight, compact, and/or highly reliable in comparison to generator modules employing current transformers.

The power converter 104 includes a rectifier 118, a direct current (DC) link 120, and an inverter 122. The rectifier 118 is a solid-state diode transformer having a diode circuit with six (6) diodes 124. The six diodes 124 are connected to the A-phase lead 112, the B-phase lead 114, and the C-phase lead 116 to sequentially apply current from the phase windings of the generator 102 to the DC link 120 as a flow of DC current 24. The DC link 120 in turn has a positive lead 128 and a negative lead 130, which connect the rectifier 118 to the inverter 122, and which provide the flow of DC current 24 to the inverter 122 for conversion into the constant frequency AC electrical power 22 (shown in FIG. 1). In certain embodiments the inverter 122 is a solid-state inverter having a plurality of solid-state switch devices.

As will be appreciated by those of skill in the art in view of the present disclosure, it can be advantageous to detect and distinguish between external faults in the rectifier 118 and internal faults in the generator 102. In the case of the generator module 100, where the generator 102 directly feeds the power converter 104 in an AC-DC-AC converter VSCF architecture, and where the power converter 104 is directly integrated into the generator 102, there are no current transformers located between the power converter 104 and the generator 102 for fault detection. Instead, the generator module 100 includes a plurality of voltage sensors coupled to the phase leads and disposed in communication with a controller 126. More particularly, each phase lead and each DC link lead includes a separate voltage sensor for measuring the voltage present in the respective lead.

In the illustrated embodiment the generator module 100 includes five (5) voltage sensors. In this respect an A-phase voltage sensor 132 is coupled to the A-phase lead 112, is disposed in communication with the controller 126, and is arranged to acquire measurements of voltage applied by the A-phase winding 106 to the A-phase lead 112 and therethrough to the inverter 122. A B-phase voltage sensor 134 is coupled to the B-phase lead 114, is disposed in communication with the controller 126, and is arranged to acquire measurements of voltage applied by the B-phase winding 108 to the B-phase lead 112 and therethrough to the inverter 122. A C-phase voltage sensor 136 is coupled to the C-phase lead 116, is disposed in communication with the controller 126, and is arranged to acquire measurements of voltage applied by the C-phase winding 108 to the C-phase lead 116 and therethrough to the inverter 122.

In further respects the generator module 100 also includes a DC link positive lead voltage sensor 138 and a DC link negative lead voltage sensor 140. The DC link positive lead voltage sensor 138 is coupled to the DC link positive lead 128, is disposed in communication with the controller 126, and is configured to acquire measurements voltage applied to the DC link positive lead 128 relative to a ground terminal 142. The DC link negative lead voltage sensor 140 is coupled to the DC link negative lead 130, is disposed in communication with the controller 126, and is configured to acquire measurements voltage applied to the DC link negative lead 130 relative to the ground terminal 142. Although a 3-phase AC generator module 100 is shown in FIG. 2 and described herein it is to be understood and appreciated that AC generator modules having two (2) phases and four (4) or more phases can also benefit from the present disclosure.

The controller 126 includes a processor 146, a device interface 148, and a user interface 150. Each of the voltage sensors, i.e. the voltage sensors 132-140, is disposed in communication with the controller 126 through device interface 148 via an external link 152, which can be wired or wireless, as suitable for an intended application. The device interface 148, the user interface 150 and the processor 146 are each disposed in communication with one another via a controller internal link 154, e.g., a communications bus, through which a memory 156 is also disposed in communication therethrough with the processor 146. The memory 156 includes a non-transitory machine-readable medium having a plurality of program modules 158 recorded thereon that, when read by the processor 146 cause the controller 126 to undertake certain actions. Among that actions are the operations of a method 200 (shown in FIG. 3) of detecting faults in the generator module 100, as will be described. It is contemplated that, in certain embodiments, the fault detection method 200 include the use of a condition table 160 recorded on the memory 156.

Figures 3, 4:
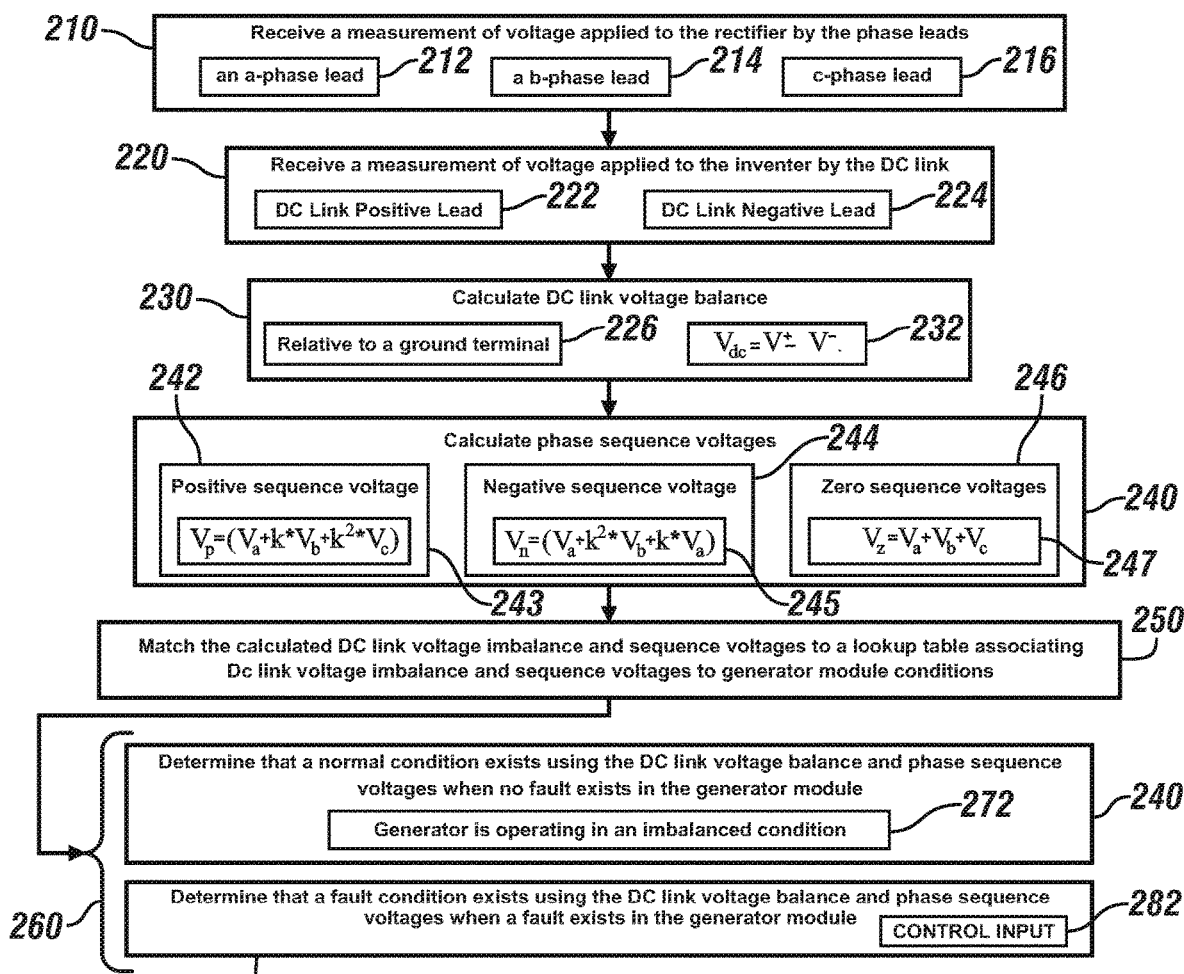
FIG. 3 is a block diagram of a fault detection method, showing steps of the method according to an embodiment.
FIG. 4 is a condition table for use in the fault detection method illustrated in FIG. 3, showing normal and fault condition associations for calculated DC link voltage imbalance and sequence voltages according to an embodiment.

Referring now to FIG. 3, the fault detection method 200 is shown. The fault detection method 200 includes, at a generator module having a generator, a rectifier connected to the generator by phase leads, and an inverter connected to the rectifier by a direct current (DC) link, e.g., the generator module 100 (shown in FIG. 1), receiving a measurement of voltage applied to the rectifier by the phase leads, as shown by box 210. In certain embodiments receiving a measurement of voltage applied to the rectifier can include measuring voltage at an A-phase lead, e.g., the A-phase lead 112 (shown in FIG. 2), a B-phase lead, e.g., the B-phase lead 114 (shown in FIG. 2), a C-phase lead, e.g., the C-phase lead 116 (shown in FIG. 2), as shown with boxes 212-216.

The fault detection method 200 also includes receiving a measurement of voltage applied to the inverter by the DC link, as shown with box 220. In certain embodiments receiving the measurement of voltage applied to the inverter by the DC link can include measuring voltage at a DC link positive lead, e.g., the DC link positive lead 128 (shown in FIG. 2), as shown with box 222. In accordance with certain embodiments receiving the measurement of voltage applied to the inverter by the DC link negative lead, e.g., the DC link negative lead 130 (shown in FIG. 2), as shown with box 224. It is contemplated that either (of both) the DC link voltage measurements can be relative to a ground terminal, e.g., the ground terminal 142 (shown in FIG. 2), as shown with box 226. DC link voltage balance is then calculated using the measurement of voltage applied to the inverter by the DC link, as shown with box 230. It is contemplated that the DC link voltage imbalance can be calculated according to: $V_{dc}=V^+-V^-$, as shown with box 232.

Sequence voltage are calculated using the measurement of voltage applied to the rectifier by the phase leads, as shown with box 240. Calculating phase sequence voltages can include calculating positive sequence voltage, negative sequence voltage, and zero sequence voltage, as shown with boxes 242-246. In certain embodiments calculating the positive sequence voltage can be according to: $V_p=(V_a+k*V_b+k^2*V_c)$, where $k=-\frac{1}{2}+j$ Sqrt $(3)/2$, as shown with box 243. In accordance with certain embodiments, calculating the negative sequence voltage can be according to: $V_n=(V_a+k^2*V_b+k*V_c)$, where $k=-\frac{1}{2}+j$ Sqrt $(3)/2$, as shown with box 245. It is also contemplated that calculating zero sequence voltage can be according to: $V_z=V_a+V_b+V_c$, as shown with box 247.

The calculated DC link voltage balance and the calculated sequence voltages are matched to a condition table associating DC link voltage imbalance and sequence voltages to generator module conditions, e.g., the condition table 160 (shown in FIG. 4), as shown with box 250. Based on the matching, determination is made regarding the operating condition of the generator module, as shown with bracket 260. In this respect a determination is made using the DC link voltage balance and phase sequence voltages when no fault exists in the generator module, as shown with box 270, or determination is made that a fault condition exists using the DC link voltage balance and phase sequence voltages when a fault exists in the generator module, as shown with box 280. In certain embodiments determining that the generator module is operating in a normal condition can include determining that a level of voltage imbalance is normal, as shown with box 272.

With reference to FIG. 4, the condition table 160 is shown. The condition table 160 includes a set condition associations that are correlated to generator operating conditions. In this respect the condition table include a set of normal operation condition associations, a set of shorted condition associations indicative of operating conditions where a phase lead is shorted to the system or chassis ground and/or to another phase lead, and a set of rectifier internal fault condition associations. In the illustrated embodiment the condition table 160 includes a NORMAL GEN ON BALANCED condition association 162, a NORMAL GEN OFF condition association 164, and NORMAL IMBALANCED condition association 166. Each of associations 162-166 are discrete associations of combinations of calculated DC link voltage imbalance and sequence voltages expressed as a percentage of an expected value. As will be appreciated by those of skill in the art in view of the present disclosure, this allows the fault detection method 200 (shown in FIG. 3) to provide indication of the operational status of the generator module 100 (shown in FIG. 1) in conjunction with a determination that the generator module 100 is operating in a normal condition.

The condition table 160 also includes a plurality of generator internal fault condition associations. In this respect the condition table 160 includes a lead-to-ground short (L-G SHORT) condition association 168, a lead-to-lead short (L-L SHORT) condition association 170, a lead-to-lead-to-ground (L-L-G SHORT) condition association 172, a lead-to-lead-to-lead (L-L-L SHORT) condition association 174, and a lead-to-lead—to-lead-ground (L-L-L-G SHORT) condition association 176. Each of associations 168-176 are also discrete associations of combinations of calculated DC link voltage imbalance and sequence voltages. As will be appreciated by those of skill in the art in view of the present disclosure, this allows the fault detection method 200 (shown in FIG. 3) to provide indication of both internal fault conditions in the generator 102 (shown in FIG. 1) as well as isolation of the fault condition to specific phase leads in the generator module 100 (shown in FIG. 1).

The condition table 160 additionally includes a plurality of generator external fault condition associations. In this respect the condition table 160 includes a 1 TO 5 DIODES SHORT condition association 178, a 1 TO 5 DIODES OPEN condition association 180, an ALL 6 DIODES SHORT condition association 182, and an ALL 6 DIODES OPEN condition association 184. Each of associations 178-184 are additionally discrete associations of combinations of calculated DC link voltage imbalance and sequence voltages. As will be appreciated by those of skill in the art in view of the present disclosure, this allows the fault detection method 200 (shown in FIG. 3) to provide indication of both external fault conditions generator 102 (shown in FIG. 1), isolation of the fault condition to within the rectifier 118 (shown in FIG. 2), and identification of whether diodes within the rectifier 118 are short or open, and in certain embodiments, the specific number of open or short diodes within the rectifier 118.

Figure 5:
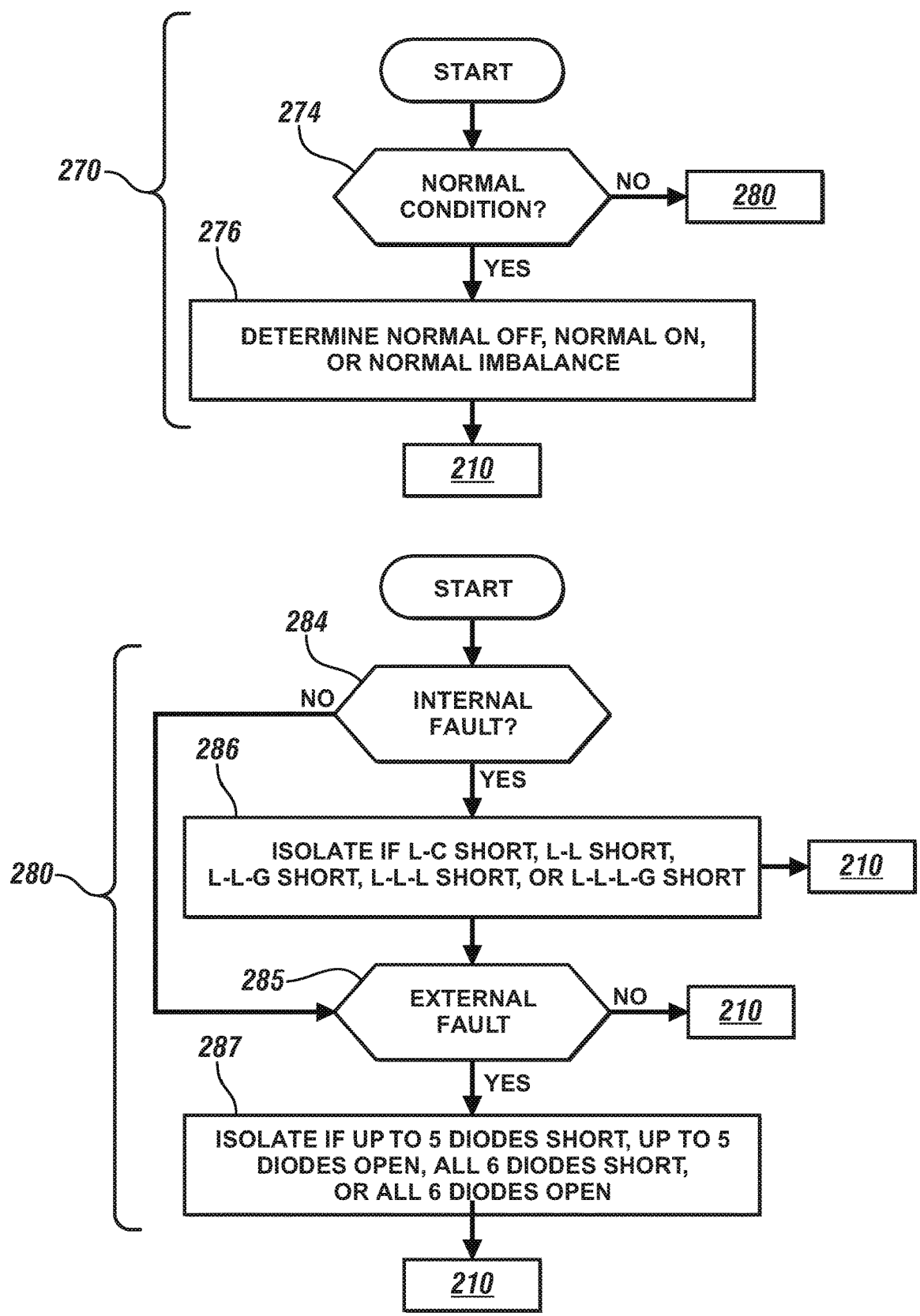
FIG. 5 is block diagram of operations for isolating faults within the generator module illustrated in FIG. 1, showing the operations.

With reference to FIG. 5, operations 270 and 280 of the fault detection method 200 (shown in FIG. 3) are shown. Determining that a normal condition exists is made using the calculated DC link voltage imbalance and sequence voltages by matching the calculated DC link voltage imbalance and sequence voltages against associations 162-166 (shown in FIG. 4) of condition table 160 (shown in FIG. 4), as shown with box 274. If a match is found normal condition is also determined, as shown with box 276, and monitoring continues. If no match among the normal conditions is found for the calculated DC link voltage imbalance and voltage sequences, determination is made whether a fault condition exists. In certain embodiments the system can be a countermeasure can be taken, such load shedding or de-energizing the system, according to the isolated fault condition.

Determining whether a fault condition exists includes determining whether an internal fault exists, as shown with box 284. If an internal fault exists based on the matching of the calculated DC link voltage balance and sequence voltages, the fault is isolated to a specific lead or set of leads, as shown with box 286, and monitoring continues. If no match is identified among the internal fault associations 170-176, the determination is made whether an external fault exists in the generator module 100 (shown in FIG. 1), as shown with box 285. If an external fault exists based on the matching of the calculated DC link voltage balance and sequence voltages the fault is isolated to a set of open diodes or shorted diodes, as shown with box 287, and monitoring continues.

The generator fault detection methods and generator modules of the present disclosure, as described above and shown in the drawings, provide for fault detection without requiring measurement of current flow through phase leads connecting the power converter to the generator in VSCF generator modules. In certain embodiments the generator fault detection methods and generator modules of the present disclosure provide generator modules without current sensors located between the power converter and the generator in VSCF generator modules, thereby providing VSCF generator modules that are lightweight, compact, and/or exhibit relatively high reliability relative to generator modules employing current sensors. While the apparatus and methods of the subject disclosure have been shown and described with reference to preferred embodiments, those skilled in the art will readily appreciate that changes and/or modifications may be made thereto without departing from the spirit and scope of the subject disclosure.

As described above, embodiments can be in the form of processor-implemented processes and devices for practicing those processes, such as a processor. Embodiments can also be in the form of computer program code containing instructions embodied in tangible media, such as network cloud storage, SD cards, flash drives, floppy diskettes, CD ROMs, hard drives, or any other computer-readable storage medium, wherein, when the computer program code is loaded into and executed by a computer, the computer becomes a device for practicing the embodiments. Embodiments can also be in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an device for practicing the embodiments. When implemented on a general-purpose microprocessor, the computer program code segments configure the microprocessor to create specific logic circuits.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A fault detection method, comprising:
   at a generator module having a generator, a rectifier connected to the generator by a plurality of phase leads, and an inverter connected to the rectifier by a direct current (DC) link,
   receiving a measurement of voltage applied to the rectifier by the phase leads;
   receiving a measurement of voltage applied to the inverter by the DC link;
   calculating DC link voltage balance and phase sequence voltages using the measurement of voltage applied to the rectifier by the phase leads and the measurement of voltage applied to the inverter by the DC link;
   determining that a normal condition exists using the DC link voltage balance and phase sequence voltages when no fault exists in the generator module; and
   determining that a fault condition exists using the DC link voltage balance and phase sequence voltages when a fault exists in the generator module.

2. The method as recited in claim 1, wherein receiving a measurement of voltage applied to the rectifier comprises measuring voltage at an A-phase lead, a B-phase lead, and a C-phase lead.

3. The method as recited in claim 2, wherein calculating phase sequence voltages comprises calculating positive sequence voltage, negative sequence voltage, and zero sequence voltage.

4. The method as recited in claim 2, wherein calculating phase sequence voltages comprises calculating positive sequence voltage according to: $V_p=(V_a+k*V_b+k^2*V_c)$, where $k=-\frac{1}{2}+j\,\text{Sqrt}\,(3)/2$.

5. The method as recited in claim 2, wherein calculating phase sequence voltages comprises calculating negative sequence voltage according to: $V_n=(V_a+k^2*V_b k*V_c)$, where $k=-\frac{1}{2}+j\,\text{Sqrt}\,(3)/2$.

6. The method as recited in claim 2, wherein calculating phase sequence voltages comprises calculating zero sequence voltage according to: $V_z=V_a+V_b+V_c$.

7. The method as recited in claim 1, wherein receiving a measurement of voltage applied to the inverter by the DC link comprises measuring voltage at a DC link positive lead and a DC link negative lead.

8. The method as recited in claim 7, wherein the measurements of voltage at the DC link positive lead and the DC link negative lead are relative to a ground terminal.

9. The method as recited in claim 7, wherein the DC link voltage imbalance is calculated according to: $V_{dc}=V^+-V^-$.

10. The method as recited in claim 1, wherein determining that a normal condition exists comprises determining that the generator is operating in an imbalanced condition.

11. The method as recited in claim 1, wherein determining that a fault condition exists includes isolating the fault condition to a fault selected from (a) L-G short, (b) L-L short, (c) L-L-G short, (d) L-L-L short, and (e) L-L-L-G short exists in the generator module.

12. The method as recited in claim 1, wherein determining that a fault condition exists includes isolating the fault condition to a diode short within the rectifier.

13. The method as recited in claim 1, wherein determining that a fault condition exists includes isolating the fault condition to a diode open within the rectifier.

14. The method as recited in claim 1, wherein determining a fault condition exists comprises matching the calculated DC link voltage imbalance and sequence voltages to a lookup table associating DC link voltage imbalance and sequence voltages to generator module conditions.

15. A generator module, comprising:
   a generator;
   a rectifier connected to the generator by a plurality of phase leads;
   an inverter connected to the rectifier by a direct current (DC) link; and a controller disposed in communication with the plurality of phase leads and the DC link, the controller responsive to instructions recorded on a memory to:

receive a measurement of voltage applied to the rectifier by the phase leads;

receive a measurement of voltage applied to the inverter by the DC link;

calculate DC link voltage balance and phase sequence voltages using the measurement of voltage applied to the rectifier by the phase leads and the measurement of voltage applied to the inverter by the DC link;

determine that a normal condition exists using the DC link voltage balance and phase sequence voltages when no fault exists in the generator module; and determine that a fault condition exists using the DC link voltage balance and phase sequence voltages when a fault exists in the generator module.

16. The generator module as recited in claim 15, wherein the plurality of phase leads comprises an A-phase lead, a B-phase lead, and a C-phase lead, and further comprising:

an A-phase voltage sensor coupled to the A-phase lead and disposed in communication with the controller;

a B-phase voltage sensor coupled to the B-phase lead and disposed in communication with the controller; and a C-phase voltage sensor coupled to the C-phase lead and disposed in communication with the controller.

17. The generator module as recited in claim 16, wherein the instructions recorded on the memory cause the controller to:

calculate positive sequence voltage according to $V_p=(V_a+k*V_b+k^2*V_c)$ where $k=-\frac{1}{2}+j\,Sqrt\,(3)/2$;

calculate negative sequence voltage according to: $V_n=(V_a+k^2*V_b+k*V_c)$; and calculate zero sequence voltage according to: $V_z=V_a+V_b V_c$ where Va is voltage applied to the A-phase lead, where Vb is voltage applied to the B-phase lead, and where Vc is voltage applied to the C-phase lead.

18. The generator module as recited in claim 13, wherein the DC link comprises a positive lead and a negative lead, the generator module further comprising:

a ground terminal;

a positive lead voltage sensor coupled the positive lead and the ground terminal, the positive lead voltage sensor disposed in communication with the controller; and a negative lead voltage sensor coupled the negative lead and the ground terminal, the negative lead voltage sensor disposed in communication with the controller.

19. The generator module as recited in claim 18, wherein the instructions cause the controller to calculate DC link voltage using the measurement of voltage applied to the inverter by the DC link according to $V_{dc}=V^+-V^-$, $V^+$ being voltage across the positive lead and the ground terminal, where $V^-$ being voltage across the negative lead and the ground terminal.

20. The generator module as recited in claim 13, wherein no current sensor is located between the generator and the rectifier to measure current through the plurality of phase leads connecting the generator to the rectifier, wherein the generator neutral phase is not connected to ground.

* * * * *